(12) United States Patent
Kim et al.

(10) Patent No.: US 7,101,650 B2
(45) Date of Patent: Sep. 5, 2006

(54) PHOTOSENSITIVE RESIN COMPOSITION FOR PHOTORESIST

(75) Inventors: Byung-Uk Kim, Hwaseong (KR); Joon-Yeon Cho, Hwaseong (KR); Kyong-Il Kwon, Hwaseong (KR); Soo-Jung Park, Hwaseong (KR); Jae-Won Yoo, Hwaseong (KR)

(73) Assignee: Dongjin Semichem Co., Ltd., Incheon (KR)

( * ) Notice: Subject to any disclaimer, the term of this patent is extended or adjusted under 35 U.S.C. 154(b) by 158 days.

(21) Appl. No.: 10/486,991

(22) PCT Filed: Aug. 20, 2002

(86) PCT No.: PCT/KR02/01574

§ 371 (c)(1),
(2), (4) Date: Feb. 18, 2004

(87) PCT Pub. No.: WO03/017001

PCT Pub. Date: Feb. 27, 2003

(65) Prior Publication Data

US 2004/0248030 A1 Dec. 9, 2004

(30) Foreign Application Priority Data

Aug. 20, 2001 (KR) ............... 2001-50089

(51) Int. Cl.
G03F 7/023 (2006.01)
(52) U.S. Cl. ............ 430/165; 430/191; 430/192; 430/193; 430/280.1; 430/281.1; 430/288.1

(58) Field of Classification Search .......... 430/165, 430/191, 192, 193, 281.1, 288.1, 280.1
See application file for complete search history.

(56) References Cited

U.S. PATENT DOCUMENTS

| 5,621,019 A | 4/1997 | Nakano et al. ............ 522/49 |
| 5,691,111 A | 11/1997 | Iwasa et al. ............ 430/270.1 |
| 6,004,720 A | 12/1999 | Takechi et al. ........... 430/270.1 |
| 6,399,267 B1* | 6/2002 | Nishimura et al. ......... 430/192 |
| 2003/0193624 A1* | 10/2003 | Kobayashi et al. .......... 349/42 |
| 2005/0042536 A1* | 2/2005 | Cho et al. .................. 430/141 |

FOREIGN PATENT DOCUMENTS

| EP | 1 085 379 | 3/2001 |
| EP | 1 122 605 | 8/2001 |

* cited by examiner

*Primary Examiner*—John S. Chu
(74) *Attorney, Agent, or Firm*—Fish & Richardson P.C.

(57) ABSTRACT

The present invention relates to a photosensitive resin composition for use as a photoresist, and more particularly, to a photosensitive resin composition for a photoresist comprising an acrylate copolymer obtained by selectively using specific compounds or controlling the ratio of unreacted monomers, and a 1,2-quinonediazide compound, which is excellent in several performance factors such as dielectric characteristics, flatness, transparency, developing performance, residual film rate, chemical resistance, and heat resistance, as well as sensitivity and resolution, and in particular it facilitates easy pattern formation into interlayer dielectrics, and it can be used as a photoresist in an LCD manufacturing process due to its excellent transmissivity even when prepared as a thick film.

16 Claims, No Drawings

PHOTOSENSITIVE RESIN COMPOSITION FOR PHOTORESIST

BACKGROUND OF THE INVENTION (a) Field of the Invention

The present invention relates to a photosensitive resin composition for use as a photoresist in an LCD manufacturing process, and more particularly, to a photosensitive resin composition comprising an acrylate copolymer having ethylenically unsaturated double bonds, which is excellent in several performance factors such as dielectric characteristics, flatness, and chemical resistance, which facilitates easy pattern formation and superior transmissivity, and which is suitable for forming interlayer dielectrics in liquid crystal display elements, integrated circuit elements, and so on.

(b) Description of the Related Art

TFT liquid crystal display elements or integrated circuit elements use interlayer dielectrics to insulate the intervals of wiring disposed between layers. For the formation of such interlayer dielectrics, photosensitive materials which have excellent flatness and lower the number of processing steps necessary to obtain interlayer dielectrics with a required pattern configuration are used.

Also, as the display quality of liquid crystal displays (LCDs) has been upgraded, the structure of TFT liquid crystal display elements has been changed, and there are increasing cases where a high degree of flatness is formed by increasing the film thickness of interlayer dielectrics.

However, when photosensitive resin compositions for interlayer dielectrics are used thickly as mentioned above, a decrease in transparency according to the increase of film thickness becomes problematic.

SUMMARY OF THE INVENTION

Therefore, the present invention has been made to provide a photosensitive resin composition which is excellent in several performance factors such as dielectric characteristics, flatness, and chemical resistance, and which facilitates easy pattern formation into an interlayer dielectric, in consideration of the problems of the prior arts as described above.

It is an another object of the invention to provide a photosensitive resin composition suitable for use as an interlayer dielectric in an LCD manufacturing process due to its excellent transmissivity, even when prepared as a thick film.

To achieve the aforementioned objects, the present invention provides a photosensitive resin composition that comprises (A) an acrylic copolymer obtained by copolymerizing i) a compound represented by the following Formula 1:

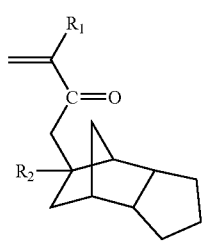

[Formula 1]

wherein $R_1$ and $R_2$ may be the same or different and are each independently a hydrogen atom, a $C_1$–$C_5$ alkyl group or a $C_1$–$C_5$ alkoxy group;

ii) an unsaturated carboxylic acid, an unsaturated carboxylic anhydride, or a mixture thereof;

iii) an epoxy group containing an unsaturated compound; and iv) an olefinically unsaturated compound; and (B) a 1,2-quinonediazide compound.

Preferably, the invention provides a photosensitive resin composition comprising (A) 100 parts by weight of an acrylic copolymer obtained by copolymerizing i) 10 to 70% by weight of a compound represented by the Formula 1; ii) 5 to 40% by weight of an unsaturated carboxylic acid, an unsaturated carboxylic anhydride, or a mixture thereof; iii) 10 to 70% by weight of an epoxy group containing an unsaturated compound; and iv) 10 to 70% by weight of an olefinically unsaturated compound; and (B) 5 to 100 parts by weight of a 1,2-quinonediazide compound.

Further, the invention provides a photosensitive resin composition comprising (A) an acrylic copolymer obtained by copolymerizing i) an unsaturated carboxylic acid, an unsaturated carboxylic anhydride, or a mixture thereof; ii) an epoxy group containing an unsaturated compound; and iii) an olefinically unsaturated compound, and (B) a 1,2-quinonediazide compound, and (C) an acrylate compound represented by the following Formula 2:

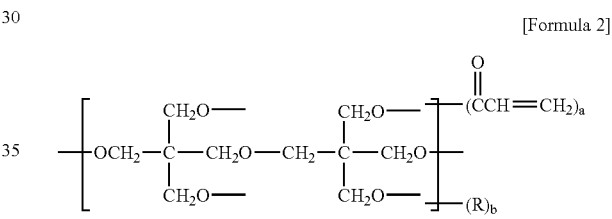

[Formula 2]

wherein R is a hydrogen atom, or an alkyl group, alkoxy group, or alkanoyl group of $C_1$–$C_5$; and $1<a<6$ and $a+b=6$.

Preferably, the invention provides a photosensitive resin composition comprising (A) 100 parts by weight of an acrylic copolymer obtained by copolymerizing i) 5 to 40% by weight of an unsaturated carboxylic acid, an unsaturated carboxylic anhydride, or a mixture thereof; ii) 10 to 70% by weight of an epoxy group containing an unsaturated compound; and iii) 10 to 70% by weight of an olefinically unsaturated compound; (B) 5 to 100 parts by weight of a 1,2-quinonediazide compound; and (C) 1 to 50 parts by weight of an acrylate compound represented by the Formula 2.

Further, the invention provides a photosensitive resin composition comprising A) an acrylic copolymer of i) an unsaturated carboxylic acid, an unsaturated carboxylic anhydride, or a mixture thereof; ii) an epoxy group containing an unsaturated compound; and iii) an olefinically unsaturated compound, wherein the area of unreacted monomers and polymerization initiators is 5% or less and its weight average molecular weight in terms of polystyrene calculation is 5,000 to 20,000 as determined by gel permeation chromatography (GPC) analysis; and (B) a 1,2-quinonediazide compound.

Preferably, the invention provides a photosensitive resin composition comprising A) 100 parts by weight of an acrylic copolymer of i) 5 to 40% by weight of an unsaturated carboxylic acid, an unsaturated carboxylic anhydride, or a mixture thereof; ii) 10 to 70% by weight of an epoxy group containing an unsaturated compound; and iii) 10 to 70% by weight of an olefinically unsaturated compound, wherein the area of unreacted monomers and polymerization initiators is 5% or less and its weight average molecular weight in terms of polystyrene calculation is 5,000 to 20,000, as determined by GPC analysis; and (B) 5 to 100 parts by weight of a 1,2-quinonediazide compound.

DETAILED DESCRIPTION AND THE PREFERRED EMBODIMENTS

The present invention is further described in detail hereinafter.

The invention is characterized by photosensitive resin compositions for photoresists comprising acrylic copolymers obtained by using specific acrylic compounds or controlling the ratio of unreacted monomers.

The following is a first preferred embodiment of the photosensitive resin compositions of the invention.

The photosensitive resin composition of the invention comprises (A) an acrylic copolymer obtained by copolymerizing i) a compound represented by the Formula 1 as defined above; ii) an unsaturated carboxylic acid, an unsaturated carboxylic anhydride, or a mixture thereof; iii) an epoxy group containing an unsaturated compound; iv) an olefinically unsaturated compound; and (B) a 1,2-quinonediazide compound.

In the photosensitive resin composition of the invention, the acrylic copolymer of (A) enables a desired pattern to be readily formed without the occurrence of scum during developing. The acrylic copolymer of (A) can be obtained by a radical reaction in the presence of a solvent and a polymerization initiator using i) a compound represented by the Formula 1; ii) an unsaturated carboxylic acid, an unsaturated carboxylic anhydride, or a mixture thereof; iii) an epoxy group containing an unsaturated compound; and iv) an olefinically unsaturated compound as a monomer.

The amount of i) the compound represented by the Formula 1 (acrylic resin) used in copolymerization in the invention is preferably 10 to 70% by weight, and more preferably 20 to 50% by weight based on the total monomers. If the amount of the compound of the Formula 1 is less than 10% by weight, the storage stability of the acrylic copolymers tends to decrease, and if it exceeds 70% by weight, it is difficult for the acrylic copolymers to dissolve in an aqueous alkali solution.

Specific examples of the compound represented by the Formula 1 are the following Formulae 1a to 1d:

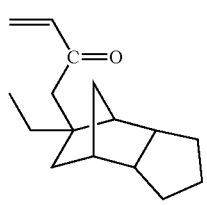

[Formula 1a]

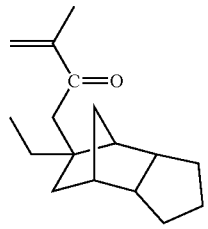

[Formula 1b]

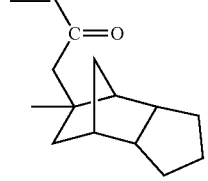

[Formula 1c]

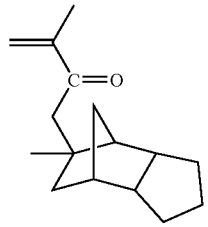

[Formula 1d]

The amount of ii) the unsaturated carboxylic acid, unsaturated carboxylic anhydride, or mixture thereof used in copolymerization in the invention is preferably 5 to 40% by weight, and more preferably 10 to 30% by weight based on the total monomers. If the amount of the above monomer is less than 5% by weight, it is difficult to dissolve in an aqueous alkali solution, and on the other hand, if it exceeds 40% by weight, solubility in aqueous alkali solution tends to be too much increased.

Specific examples of the compound of the above ii) are unsaturated monocarboxylic acids such as acrylic acid and methacrylic acid; unsaturated dicarboxylic acids such as maleic acid, fumaric acid, citraconic acid, mesaconic acid, and itaconic acid; and the anhydrides of the unsaturated dicarboxylic acid, etc., and they may be used alone or in a mixture of two or more kinds. Of them, it is preferable to use acrylic acid, methacrylic acid, or maleic anhydride because they are excellent in copolymerization reactivity and solubility in an aqueous alkali solution.

The amount of iii) the epoxy group containing an unsaturated compound used in copolymerization in the invention is preferably 10 to 70% by weight, and more preferably 20 to 60% by weight based on the total monomers. If the amount of the epoxy containing the unsaturated compound is less than 10% by weight, the heat resistance of the obtained pattern tends to be decreased, and if it exceeds 70% by weight, the storage stability of the copolymer tends to be decreased.

As the epoxy containing the unsaturated compound, there are glycidyl acrylate, glycidyl methacrylate, glycidyl α-ethylacrylate, glycidyl α-n-propylacrylate, glycidyl α-n-butylacrylate, acrylic acid-β-methylglycidyl, methacrylic acid-β-methylglycidyl, acrylic acid-β-ethylglycidyl, methacrylic acid-β-ethylglycidyl, acrylic acid-3,4-epoxybutyl, methacrylic acid-3,4-epoxybutyl, acrylic acid-6,7-epoxyheptyl, methacrylic acid-6,7-epoxyheptyl, α-ethylacrylic acid-6,7-epoxyheptyl, o-vinylbenzyl glycidyl ether, m-vinylbenzyl glycidyl ether, p-vinylbenzyl glycidyl ether, etc., and they may be used alone or in a mixture of two or more kinds. It is preferable to use glycidyl methacrylate, methacrylic acid-β-methylglycidyl, methacrylic acid-6,7-epoxyheptyl, o-vinylbenzyl glycidyl ether, m-vinylbenzyl glycidyl ether, or p-vinylbenzyl glycidyl ether, because they raise copolymerization reactivity and heat resistance of the obtained pattern.

The amount of iv) the olefinically unsaturated compound used in copolymerization in the invention is preferably 10 to 70% by weight, and more preferably 20 to 50% by weight based on the total monomers. If the amount of the olefinically unsaturated compound is less than 10% by weight, the storage stability of the acrylic copolymer tends to be decreased, and if it exceeds 70% by weight, it is difficult for the acrylic copolymer to dissolve in the aqueous alkali solution.

Specific examples of the olefinically unsaturated compound are methyl methacrylate, ethylmethacrylate, n-butyl methacrylate, sec-butyl methacrylate, t-butyl methacrylate, methylacrylate, isopropyl acrylate, cyclohexyl methacrylate, 2-methylcyclo hexylmethacrylate, dicyclo pentanyloxyethylmethacrylate, isobornyl methacrylate, cyclohexylacrylate, 2-methylcyclohexylacrylate, dicyclopentanyloxyethylacrylate, isobornyl acrylate, phenylmethacrylate, phenylacrylate, benzylacrylate, 2-hydroxyethylmethacrylate, styrene, α-methyl styrene, m-methyl styrene, p-methyl styrene, vinyl toluene, p-methoxy styrene, 1,3-butadiene, isoprene, 2,3-dimethyl 1,3-butadiene, etc., and they may be used alone or in a mixture of two or more kinds. Preferably, styrene, dicyclopentanyl methacrylate, or p-methoxystyrene is used in view of copolymerization reactivity and solubility in the aqueous alkali solution.

Specific examples of the solvent used in the polymerization of the acrylic copolymer include methanol, and ethers such as tetrahydrofuran, ethyleneglycol monomethylether, ethyleneglycol monoethylether, methylcellosolveacetate, ethylcellosolveacetate, diethyleneglycol monomethylether, diethyleneglycol monoethylether, ethyleneglycol dimethylether, ethyleneglycol diethylether, ethyleneglycol methylethylether, propyleneglycol monomethylether, propyleneglycol monoethylether, propyleneglycol propylether, propyleneglycol butylether, propyleneglycol methyletheracetate, propyleneglycol ethyletheracetate, propyleneglycol propyletheracetate, propyleneglycol butyletheracetate, propyleneglycol methyletherpropionate, propyleneglycol ethyletherpropionate, propyleneglycol propyletherpropionate, propyleneglycol butyletherpropionate, toluene, xylene, methylethylketone, cyclohexanone, 4-hydroxy 4-methyl 2-pentanone, methyl acetate, ethyl acetate, propyl acetate, butyl acetate, ethyl 2-hydroxy propionate, methyl 2-hydroxy 2-methyl propionate, ethyl 2-hydroxy 2-methyl propionate, methyl hydroxy acetate, ethyl hydroxy acetate, butyl hydroxy acetate, methyl lactate, ethyl lactate, propyl lactate, butyl lactate, methyl 3-hydroxy propionate, ethyl 3-hydroxy propionate, propyl 3-hydroxy propionate, butyl 3-hydroxy propionate, methyl 2-hydroxy 3-methyl butanoic acid, methyl methoxy acetate, ethyl methoxy acetate, propyl methoxy acetate, butyl methoxy acetate, methyl ethoxy acetate, ethyl ethoxy acetate, propyl ethoxy acetate, butyl ethoxy acetate, methyl propoxy acetate, ethyl propoxy acetate, propyl propoxy acetate, butyl propoxy acetate, methyl butoxy acetate, ethyl butoxy acetate, propyl butoxy acetate, butyl butoxy acetate, methyl 2-methoxy propionate, ethyl 2-methoxy propionate, propyl 2-methoxy propionate, butyl 2-methoxy propionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate, and butyl 3-butoxypropionate, and they may be used alone or in a mixture of two or more kinds.

The polymerization initiator used in the preparation of the acrylic copolymer is a radical polymerization initiator, and for example, 2,2'-azobisisobutyronitrile, 2,2'-azobis(2,4-dimethylvaleronitrile), 2,2'-azobis(4-methoxy 2,4-dimethylvaleronitrile), 1,1'-azobis(cyclohexane-1-carbonitrile), and dimethyl 2,2'-azobisisobutylate can be used.

In the present invention, the acrylic copolymer prepared from the compound of the above Formula 1 preferably has a weight average molecular weight (Mw) of from 5,000 to 30,000, and more preferably from 5,000 to 20,000 in terms of polystyrene calculation. In the case of a film where the Mw is obtained in a range of less than 5,000, there is a tendency that developing performance, residual film rate, etc. decrease, or pattern configuration, heat resistance, etc. are inferior, and in the case that the Mw exceeds 30,000, there is a tendency for the sensitivity to decrease or the pattern configuration to be inferior.

In the photosensitive resin composition of the invention, it is preferable to use (B) a 1,2-quinonediazide compound as a photosensitive compound. Specific examples of the 1,2-quinonediazide compound are 1,2-quinonediazide 4-sulfonic ester, 1,2-quinonediazide 5-sulfonic ester, 1,2-quinonediazide 6-sulfonic ester, and so on.

The above quinonediazide compound is obtained by the reaction of a naptoquinonediazidesulfonyl halogen compound and a phenol compound in the presence of a weak base.

Specific examples of the phenol compound include 2,3,4-trihydroxybenzophenone, 2,4,6-trihydroxybenzophenone, 2,2' or 4,4'-tetrahydroxybenzophenone, 2,3,4,3'-tetrahydroxybenzophenone, 2,3,4,4'-tetrahydroxybenzophenone, 2,3,4,2'-tetrahydroxy 4'-methylbenzophenone, 2,3,4,4'-tetrahydroxy 3'-methoxybenzophenone, 2,3,4,2' or 2,3,4,6'-pentahydroxybenzophenone, 2,4,6,3', 2,4,6,4' or 2,4,6,5'-hexahydroxybenzophenone, 3,4,5,3', 3,4,5,4' or 3,4,5,5'-hexahydroxybenzophenone, bis(2,4-dihydroxyphenyl)methane, bis(p-hydroxyphenyl)methane, tri(p-hydroxyphenyl)methane, 1,1,1-tri(p-hydroxyphenyl)ethane, bis(2,3,4-trihydroxyphenyl)methane, 2,2-bis(2,3,4-trihydroxyphenyl)propane, 1,1,3-tris(2,5-dimethyl 4-hydroxyphenyl)-3-phenylpropane, 4,4'-[1-[4-[1-[4-hydroxyphenyl]-1-methylethyl]phenyl]ethyllidene]bisphenol, bis(2,5-dimethyl 4-hydroxyphenyl)-2-hydroxyphenylmethane, etc., and they may be used alone or in a mixture of two or more kinds.

In the synthesis of the above compound, it is preferred that the esterification rate is 50 to 85%. If the esterification rate is less than 50%, the residual film rate tends to be deteriorated, and if it exceeds 85%, storage stability may tend to be lowered.

The 1,2-quinonediazide compound is preferably used in an amount of 5 to 100 parts by weight, and more preferably 10 to 50 parts by weight based on 100 parts by weight of the acrylic copolymer of the above (A). If the amount of the 1,2-quinonediazide compound is less than 5 parts by weight, a difference in solubility between a light exposed region and a non-exposed region becomes small and pattern formation is thus difficult, and if it exceeds 100 parts by weight, a large quantity of unreacted 1,2-quinonediazide compounds remain when exposed to light for a short time and as a result, solubility in aqueous alkali solution becomes too low and developing becomes difficult.

If necessary, the photosensitive resin composition of the invention may further comprise (C) a polymerizable compound having ethylenically unsaturated double bonds, (D) an epoxy resin, (E) an adhesion promotor, and (F) a surfactant.

The polymerizable compound having ethylenically unsaturated double bonds of (C) can improve the heat resistance, sensitivity, etc. of the pattern obtained from the photosensitive resin composition. The polymerizable compounds having ethylenically unsaturated double bonds are, for example, monofunctional methacrylate, difunctional methacrylate, or tri- or more functional methacrylate. Preferably, there are mono functional methacrylates such as 2-hydroxyethyl methacrylate, isobornyl methacrylate, 3-methoxybutyl methacrylate, and 2-methacrylyloxyethyl 2-hydroxypropylphthalate; difunctional methacrylates such as ethyleneglycol methacrylate, 1,6-hexanedioldimethacrylate, 1,9-nonanediol dimethacrylate, propyleneglycol methacrylate, tetraethyleneglycol methacrylate, bisphenoxyethanol fluorenediacrylate, and bisphenoxyethanol fluorenediacrylate; and tri- or more functional methacrylates such as trimethylolpropane trimethacrylate, pentaerythritol trimethacrylate, pentaerythritol tetramethacrylate, dipentaerythritol pentamethacrylate, and dipentaerythritol hexamethacrylate, etc., and they may be used alone or in a mixture of two more kinds. The compound of (C) is preferably used at 1 to 50 parts by weight, and more preferably 5 to 30 parts by weight based on 100 parts by weight of the acrylic copolymer of the above (A).

The epoxy resin of (D) can improve the heat resistance, sensitivity, etc. of the pattern obtained from the photosensitive resin composition. Specific examples of the epoxy resin include bisphenol A-type epoxy resin, phenol novolak-type epoxy resin, cresol novolak-type epoxy resin, alicyclic epoxy resin, glycidyl ester-type epoxy resin, glycidyl amine-type epoxy resin, heterocyclic epoxy resin, and the resins (co) polymerized with glycidyl methacrylates other than the acrylic copolymer of (A). It is preferable to use bisphenol A-type epoxy resin, cresol novolak-type epoxy resin, or glycidyl ester-type epoxy resin. The epoxy resin is preferably used in an amount of 0.1 to 30 parts by weight based on 100 parts by weight of alkali-soluble resin. If the amount exceeds 30 parts by weight, sufficient coating performance cannot be achieved due to low compatibility with the alkali-soluble resin.

The adhesion promotor of (E) is used to improve adhesion onto a substrate, and it may be used in an amount of 0.1 to 20 parts by weight based on 100 parts by weight of the acrylic copolymer. As the adhesion promotor, a silane coupling agent having reactive substituents such as a carboxyl group, a methacryl group, an isocyanate group, and an epoxy group can be used. For specific examples, there are γ-methacryloxypropyltrimethoxysilane, vinyltriacetoxysilane, vinyltrimethoxysilane, γ-isocyanate propyltriethoxysilane, γ-glycidoxypropyltrimethoxysilane, β-(3,4-epoxy)cyclohexyl ethyltrimethoxysilane, etc.

The surfactant of (F) is used to improve the coating performance or developing performance of the photosensitive compositions. Such surfactants include polyoxyethyleneoctylphenylether, polyoxyethylenenonylphenylether, F171, F172, F173 (Trade names; Dinippon Ink & Chemical, Inc.), FC430, FC431 (Trade names: Sumitomotriem, Inc.) and KP341 (Trade name; Shinetsu Chemical Industrial, Inc.). The surfactant is preferably used in an amount of 0.0001 to 2 parts by weight based on 100 parts by weight of the solid portion.

The following is a second preferred embodiment of the photosensitive resin compositions of the invention.

The photosensitive resin composition of the invention comprises (A) an acrylic copolymer obtained by copolymerizing i) an unsaturated carboxylic acid, an unsaturated carboxylic anhydride, or a mixture thereof; ii) an epoxy group containing an unsaturated compound; and iii) an olefinically unsaturated compound, (B) 1,2-quinonediazide compound, and (C) an acrylate compound represented by the following Formula 2:

[Formula 2]

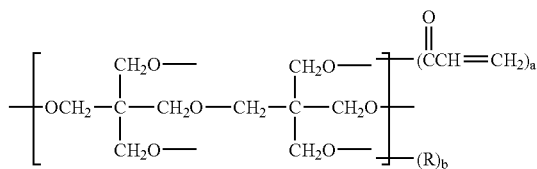

wherein R is a hydrogen atom, or an alkyl group, alkoxy group, or alkanoyl group of $C_1$–$C_5$; and $1<a<6$ and $a+b=6$.

In the photosensitive resin composition of the invention, the acrylic copolymer of (A) enables a desired pattern where scum does not occur to be readily formed. The acrylic copolymer (A) can be obtained by a radical reaction in the presence of a solvent and a polymerization initiator using i) an unsaturated carboxylic acid, an unsaturated carboxylic anhydride, or a mixture thereof; ii) an epoxy group containing an unsaturated compound; and iii) an olefinically unsaturated compound, as monomers.

With regard to i) the unsaturated carboxylic acid, unsaturated carboxylic anhydride, or mixture thereof; ii) the epoxy group containing unsaturated compound; and iii) the olefinically unsaturated compound used in copolymerization in the invention, the same compounds as those used in the first preferred embodiment can be used in the same amounts.

Also, with regard to (B) the 1,2-quinonediazide compound used as the photosensitive compound in the invention, the same compounds as those used in the first preferred embodiment can be used in the same amounts.

In particular, the photosensitive resin composition of the invention can improve the heat resistance, transparency, sensitivity, etc. of the pattern obtained from the photosensitive resin composition by virtue of the use of the acrylate compound having ethylenically unsaturated double bonds represented by the Formula 2. The acrylate compound represented by the Formula 2 may be used alone or in a mixture of two or more kinds.

Further, the invention may use the acrylate compound of the Formula 2 in an admixture with a monofunctional methacrylate, difunctional methacrylate, or tri- or more functional methacrylate having the ethylenically unsaturated double bonds of different kinds. The monofunctional methacrylate, difunctional methacrylate, or tri- or more functional methacrylate include, for example, mono functional methacrylates such as 2-hydroxyethyl methacrylate, isobornyl methacrylate, 3-methoxybutyl methacrylate, and 2-methacrylyloxyethyl 2-hydroxypropylphthalate; difunctional methacrylates such as ethyleneglycol methacrylate, 1,6-hexanedioldimethacrylate, 1,9-nonanediol dimethacrylate, propyleneglycol methacrylate, tetraethyleneglycol methacrylate, bisphenoxyethanol fluorenediacrylate, and bisphenoxyethanol fluorenediacrylate; and tri- or more functional methacrylates such as trimethylolpropane trimethacrylate.

The acrylate compound of the Formula 2 of (C) is preferably used in an amount of 1 to 50 parts by weight, and more preferably 5 to 30 parts by weight based on the 100 parts by weight of the acrylic copolymer of (A).

Moreover, if necessary, the photosensitive resin composition of the invention may further comprise (D) an epoxy resin, (E) an adhesion promotor, and (F) a surfactant. With regard to (D) the epoxy resin, (E) adhesion promotor, and (F) surfactant, the same compounds as those used in the first preferred embodiment can be used in the same amounts.

The following is a third preferred embodiment of the photosensitive resin compositions of the invention.

The photosensitive resin composition of the invention comprises A) an acrylic copolymer of i) an unsaturated carboxylic acid, an unsaturated carboxylic anhydride, or a mixture thereof; ii) an epoxy group containing an unsaturated compound; and iii) an olefinically unsaturated compound, wherein the area of unreacted monomers and polymerization initiators is 5% or less and its weight average molecular weight in terms of polystyrene calculation is 5,000 to 20,000, as determined by gel permeation chromatography (GPC) analysis, and (B) a 1,2-quinonediazide compound.

In the photosensitive resin composition of the invention, the acrylic copolymer of (A) enables a desired pattern to be readily formed without the occurrence of scum during developing. The acrylic copolymer (A) can be obtained by a radical reaction in the presence of a solvent and a polymerization initiator using i) an unsaturated carboxylic acid, an unsaturated carboxylic anhydride, or a mixture thereof; ii) an epoxy group containing an unsaturated compound; and iii) an olefinically unsaturated compound, as monomers, wherein it is important to prepare the polymer such that the area of the unreacted monomers and polymerization initiator is 5% or less and the final molecular weight of the copolymer is 5,000 to 20,000 as determined by GPC analysis.

For the above, the polymerization of the acrylic copolymer of (A) is performed in a solvent that is excellent in solubility for copolymerization, and then a poor solvent that has low solubility for the copolymer of (A) is dripped into or mixed with the copolymer solution thus obtained to precipitate the copolymer solution. Thereafter, a solution layer containing the precipitated copolymer is isolated and recovered, whereby the copolymer solution where the area of the unreacted monomers and polymerization initiator is 5% or less is obtained. In other words, the area of the unreacted monomers and polymerization initiator is adjusted to 5% or less of the total area by the removal thereof through the GPC analysis of the copolymer solution. If the area of the unreacted monomers and polymerization initiator is 5% or more, transparency and residual film rate are lowered and it may have an adverse effect on heat resistance and chemical resistance. It is preferred that the above poor solvent is one or more selected from the group consisting of water, hexane, heptane, and toluene.

The acrylic copolymer obtained in such a way should have a weight average molecular weight (Mw) of 5,000 to 20,000 in terms of polystyrene calculation. If the Mw is less than 5,000, there is a tendency that developing performance, residual film rate, etc. are decreased, or pattern configuration, heat resistance, etc. are inferior, and if the Mw exceeds 20,000, there is a tendency for sensitivity to decrease or pattern configuration to be inferior.

With regard to i) the unsaturated carboxylic acid, unsaturated carboxylic anhydride, or mixture thereof; ii) the epoxy group containing an unsaturated compound; and iii) the olefinically unsaturated compound used in copolymerization in the invention, respectively, the same compounds as those used in the first preferred embodiment can be used in the same amounts.

Also, with regard to (B) the 1,2-quinonediazide compound used as a photosensitive compound in the invention, the same compounds as those used in the first preferred embodiment can be used in the same amounts.

Furthermore, the invention may provide a coating solution of a photosensitive resin composition by the addition of a solvent to the photosensitive resin compositions of the preferred embodiments, comprising (A) the acrylic copolymer and (B) the 1,2-quinonediazide compound, and if necessary, further comprising components (C) to (F).

The solid concentration of the above photosensitive resin composition coating solution is preferably 30 to 70% by weight, and it is used after filtration using a milipore filter of 0.2 μm or so.

As the solvents used for the preparation of the above photosensitive resin composition coating solution, there are alcohols such as methanol and ethanol; ethers such as tetrahydrofuran; glycolethers such as ethyleneglycol monomethylether and ethyleneglycol monoethylether; ethyleneglycolalkylether acetates such as methylcellosolveacetate and ethylcellosolveacetate; diethyleneglycols such as diethyleneglycolmonomethylether, diethyleneglycolmonoethylether, and diethyleneglycol dimethylether; propyleneglycolmonoalkylethers such as propyleneglycolmethylether, propyleneglycolethylether, propyleneglycolpropylether, and propyleneglycolbutylether; propyleneglycolalkyletheracetates such as propyleneglycolmethyletheracetate, propyleneglycolethyletheracetate, propyleneglycolpropyletheracetate, and propyleneglycol butyletheracetate; propyleneglycol alkyletherpropionates such as propyleneglycol methyletherpropionate, propyleneglycol ethyletherpropionate, propyleneglycol propyletherpropionate, and propyleneglycol butyletherpropionate; aromatic hydrocarbons such as toluene and xylene; ketones such as methylethylketone, cyclohexanone, and 4-hydroxy 4-methyl 2-pentanone; and esters such as methyl acetate, ethyl acetate, propyl acetate, butyl acetate, ethyl 2-hydroxy propionate, methyl 2-hydroxy 2-methyl propionate, ethyl 2-hydroxy 2-methyl propionate, methyl hydroxy acetate, ethyl hydroxy acetate, butyl hydroxy acetate, methyl lactate, ethyl lactate, propyl lactate, butyl lactate, methyl 3-hydroxy propionate, ethyl 3-hydroxy propionate, propyl 3-hydroxy propionate, butyl 3-hydroxy propionate, methyl 2-hydroxy 3-methyl butanoic acid, methyl methoxy acetate, ethyl methoxy acetate, propyl methoxy acetate, butyl methoxy acetate, methyl ethoxy acetate, ethyl ethoxy acetate, propyl ethoxy acetate, butyl ethoxy acetate, methyl propoxy acetate, ethyl propoxy acetate, propyl propoxy acetate, butyl propoxy acetate, methyl butoxy acetate, ethyl butoxy acetate, propyl butoxy acetate, butyl butoxy acetate, methyl 2-methoxy propionate, ethyl 2-methoxy propionate, propyl 2-methoxy propionate, butyl 2-methoxy propionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate, and butyl 3-butoxypropionate. Preferably, they are selected from the group consisting of glycolethers, ethyleneglycolalkyletheracetates and diethyleneglycols in view of solubility, reactivity with each component, and ease in formation of the coating film.

The photosensitive resin compositions obtained above in the invention are coated on the surface of substrates by a spray method, roll coater method, or spin coating method, and pre-baked to remove solvents, thereby forming a coating film. The pre-baking is preferably conducted at 70 to 110° C. for 1 to 15 minutes. Then, the coating film is irradiated with visible light rays, ultraviolet rays, far ultraviolet rays, electron rays, X-rays, etc. and developed with a developing solution to remove unnecessary portions, thereby forming a desired pattern.

Aqueous alkali solutions are used as the developing solution. For example, aqueous solutions of inorganic alkalies such as sodium hydroxide, potassium hydroxide, and sodium carbonate; primary amines such as ethyl amine and n-propyl amine; secondary amines such as diethyl amine; tertiary amines such as trimethyl amine, methyldiethylamine, dimethylethylamine, and triethylamine; alcohol amines such as dimethylethanolamine, methyldiethanolamine, and triethanolamine; and aqueous quaternary ammonium salts such as tetramethylammoniumhydroxide and tetraethylammoniumhydroxide can be used. The developing solution is used by dissolving alkaline compounds at a concentration of 0.1 to 10% in water-soluble organic solvents such as methanol and ethanol, and a surface active agent may be added thereto in a suitable amount.

After the developing, the film is rinsed with ultrapure water for 30 to 90 seconds to remove unnecessary portions, thereby forming a pattern. The formed pattern is irradiated with light such as ultraviolet and treated with heat in a heating apparatus such as an oven at 150 to 250° C. for 30 to 90 minutes, whereby a final pattern can be obtained.

The present invention is hereinafter described with reference to the following examples and comparative examples. However, these examples should be understood only to illustrate the invention, and the present invention should not be construed to be limited thereto.

EXAMPLES

Synthesis Example 1

10 parts by weight (pbw) of 2,2'-azobis(2,4-dimethylvaleronitrile), 125 pbw of propyleneglycol monomethyletheracetate, 25 pbw of the compound of the Formula 1a, 20 pbw of methacrylic acid, 50 pbw of styrene, and 5 pbw of 2-hydroxy ethylacrylate were put into a flask with a cooling tube and stirrer, then nitrogen-substituted, and gently agitated. The temperature of the reaction solution was raised to 62° C. and maintained at this temperature for five hours, whereby a polymer solution comprising the acrylic copolymer [A-1] was obtained. The solid concentration of the polymer solution thus obtained was 45% by weight, and the weight average molecular weight of the polymer was 12,000. The weight average molecular weight used herein refers to an average molecular weight in terms of polystyrene calculation determined by use of GPC analysis.

Synthesis Example 2

10 pbw of 2,2'-azobis(2,4-dimethylvaleronitrile), 125 pbw of propyleneglycol monomethyletheracetate, 25 pbw of the compound of the Formula 1b, 20 pbw of methacrylic acid, 50 pbw of styrene, and 5 pbw of 2-hydroxy ethylacrylate were put into a flask with a cooling tube and stirrer, then nitrogen-substituted, and gently agitated. The temperature of the reaction solution was raised to 62° C. and maintained at this temperature for five hours, whereby a polymer solution comprising the acrylic copolymer [A-2] was obtained. The solid concentration of the polymer solution thus obtained was 45% by weight, and the weight average molecular weight of the polymer was 11,800. The weight average molecular weight used herein refers to an average molecular weight in terms of polystyrene calculation determined by use of GPC analysis.

Synthesis Example 3

10 pbw of 2,2'-azobis(2,4-dimethylvaleronitrile), 125 pbw of propyleneglycol monomethyletheracetate, 25 pbw of the compound of the Formula 1c, 20 pbw of methacrylic acid, 50 pbw of styrene, and 5 pbw of 2-hydroxy ethylacrylate were put into a flask with a cooling tube and stirrer, then nitrogen-substituted, and gently agitated. The temperature of the reaction solution was raised to 62° C. and maintained at this temperature for five hours, whereby a polymer solution comprising the acrylic copolymer [A-3] was obtained. The solid concentration of the polymer solution thus obtained was 45% by weight, and the weight average molecular weight of the polymer was 13,400. The weight average molecular weight used herein refers to an average molecular weight in terms of polystyrene calculation determined by use of GPC analysis.

Synthesis Example 4

10 pbw of 2,2'-azobis(2,4-dimethylvaleronitrile), 125 pbw of propyleneglycol monomethyletheracetate, 25 pbw of the compound of the Formula 1d, 20 pbw of methacrylic acid, 50 pbw of styrene, and 5 pbw of 2-hydroxy ethylacrylate were put into a flask with a cooling tube and stirrer, then nitrogen-substituted, and gently agitated. The temperature of the reaction solution was raised to 62° C. and maintained at this temperature for five hours, whereby a polymer solution comprising the acrylic copolymer [A-4] was obtained. The solid concentration of the polymer solution thus obtained was 45% by weight, and the weight average molecular weight of the polymer was 13,400. The weight average molecular weight used herein refers to an average molecular weight in terms of polystyrene calculation determined by use of GPC analysis.

Comparative Synthesis Example 1

10 pbw of 2,2'-azobis(2,4-dimethylvaleronitrile), 125 pbw of propyleneglycol monomethyletheracetate, 25 pbw of methacrylic acid, 50 pbw of styrene, 5 pbw of 2-hydroxy ethylacrylate, and 20 pbw of benzylmethacrylate were put into a flask with a cooling tube and stirrer, then nitrogen-substituted, and gently agitated. The temperature of the reaction solution was raised to 62° C. and maintained at this temperature for five hours, whereby a polymer solution comprising the acrylic copolymer [a-1] was obtained. The solid concentration of the polymer solution thus obtained was 45% by weight, and the weight average molecular weight of the polymer was 16,700. The weight average molecular weight used herein refers to an average molecular weight in terms of polystyrene calculation determined by use of GPC analysis.

Synthesis Example 6

Preparation of 1,2-Quinonediazide Compound

[4,4'-[1-[4-[1-[4-Hydroxyphenyl]-1-methylethyl]phenyl]ethyllidene]bisphen ol 1,2-naptoquinonediazide-5-sulfonic ester] was prepared by a condensation reaction of 1 mol of [4,4'-[1-[4-[1-[4-hydroxyphenyl]-1-methylethyl]phenyl]ethyllidene]bisphenol and 2 mols of 1,2-naptoquinonediazide-5-sulfonyl [chloride].

Example 1

Preparation of Photosensitive Resin Composition 100 pbw of the polymer solution obtained from Synthesis Example 1 (copolymer [A-1]) and 25 pbw of the condensate obtained from Synthesis Example 6, [4,4'-[1-[4-[1-[4-hydroxyphenyl]-1-methylethyl]phenyl]ethyllidene]bisphenol 1,2-naptoquinonediazide-5-sulfonic ester], were mixed, dissolved in propyleneglycol monomethyletheracetate to the extent that the solid concentration became 35% by weight, and then filtered with a milipore filter of 0.2 µm to prepare a solution of a photosensitive resin composition.

With regard to the photosensitive resin composition prepared above, physical properties were evaluated in the following manner, and the results are shown in Table 1 below.

1) Sensitivity: The above composition solution was coated on glass substrates by use of a spin coater and pre-baked on hot plates at 90° C. for 2 minutes, thereby forming a film.

The film obtained above was irradiated with ultraviolet rays at a strength of 15 mW/cm$^2$ at 365 nm for 15 seconds through a predetermined pattern mask. Subsequently, it was developed with 2.38 wt % aqueous solution of tetramethylammoniumhydroxide at 25° C. for 1 minute, and then rinsed with ultrapure water for 1 minute.

Thereafter, the pattern formed above was irradiated with ultraviolet rays at a strength of 15 mW/cm$^2$ at 365 nm for 34 seconds, and hardened by heating in an oven at 220° C. for 60 minutes, whereby a patterned film was obtained.

2) Resolution: Evaluated by a minimum size formed in the patterned film obtained from 1) above.

3) Transparency: Evaluated by transmissivity at 400 nm of the patterned film determined by use of a spectrophotometer.

4) Resistance to Heat Discoloration: Evaluated by change in transmissivity of the patterned film between before and after the substrate was heated in a 250° C. oven for 1 hour. The change rates are marked as [o] in the case of less than 5%, [Δ] in the case of 5 to 10% and [x] in the case of exceeding 10%.

Example 2

The composition solution was prepared according to the same method as used in Example 1, except that the polymer solution prepared in Synthesis Example 2 was used instead of the polymer solution prepared in Synthesis Example 1, and its physical properties were evaluated and the results are shown in Table 1 below.

Example 3

The composition solution was prepared according to the same method as used in Example 1, except that the polymer solution prepared in Synthesis Example 3 was used instead of the polymer solution prepared in Synthesis Example 1, and its physical properties were evaluated and the results are shown in Table 1 below.

Example 4

The composition solution was prepared according to the same method as used in Example 1, except that the polymer solution prepared in Synthesis Example 4 was used instead of the polymer solution prepared in Synthesis Example 1, and its physical properties were evaluated and the results are shown in Table 1 below.

Comparative Example 1

The composition solution was prepared according to the same method as used in Example 1, except that the polymer solution prepared in Comparative Synthesis Example 1 was used instead of the polymer solution prepared in Synthesis Example 1, and its physical properties were evaluated and the results are shown in Table 1 below.

TABLE 1

| Category | Sensitivity (mJ/cm$^2$) | Resolution (µm) | Transparency (%) | Resistance to Heat Discoloration |
|---|---|---|---|---|
| Example 1 | 170 | 2 | 91 | ○ |
| Example 2 | 170 | 1 | 90 | ○ |
| Example 3 | 150 | 2 | 91 | ○ |
| Example 4 | 160 | 2 | 90 | ○ |
| Comparative Example 1 | 200 | 5 | 86 | X |

From the above Table 1, it can be seen that Examples 1 to 4 according to the present invention, wherein the acrylic copolymer comprising the photosensitive compound of the Formula 1 was used, have excellent sensitivity at 150 to 170 mJ/cm$^2$, they exhibit high resolution, and they are very excellent especially in transparency and resistance to heat discoloration, which can eliminate difficulties of interlayer dielectrics in a thick film for a high degree of flatness. To the contrary, in Comparative Example 1, sensitivity and resolution are poor, and transparency is low, and consequently it is difficult for the polymer to be applied in a thick film, and resistance to heat discoloration is not good.

Synthesis Example 7

Preparation of Acrylic Copolymer 10 pbw of 2,2'-azobis(2,4-dimethylvaleronitrile), 125 pbw of propyleneglycol monomethyletheracetate, 20 pbw of methacrylic acid, 25 pbw of glycidyl methacrylate, 40 pbw of styrene, 5 pbw of 2-hydroxy ethylacrylate, and 10 pbw of isobornylacrylate were put into a flask with a cooling tube and stirrer, then nitrogen-substituted, and gently agitated. The temperature of the reaction solution was raised to 62° C. and maintained at this temperature for five hours, whereby a polymer solution comprising the acrylic copolymer [A-1] was obtained. The solid concentration of the polymer solution thus obtained was 45% by weight, and the weight average molecular weight of the polymer was 13,000. The weight average molecular weight used herein refers to an average molecular weight in terms of polystyrene calculation determined by use of GPC analysis.

Example 5

Preparation of Photosensitive Resin Composition 100 pbw of the polymer solution obtained from Synthesis Example 7 (copolymer [A-1]), and 25 pbw of the condensate obtained from Synthesis Example 6, [4,4'-[1-[4-[1-[4-hydroxyphenyl]-1-methylethyl]phenyl]ethyllidene]bisphenol 1,2-naptoquinonediazide-5-sulfonic ester], and 15 pbw of the acrylate compound of the following Formula 2a:

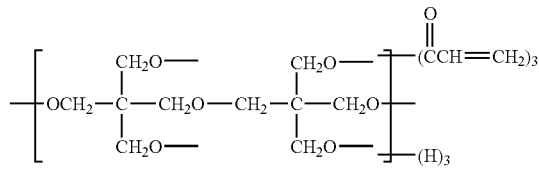

2a were mixed, dissolved in diethyleneglycol dimethylether to the extent that the solid concentration became 35% by weight, and then filtered with a milipore filter of 0.2 μm to prepare a photosensitive resin composition solution.

With regard to the photosensitive resin composition prepared above, physical properties were evaluated in the same manner as described above, and the results are shown in Table 2 below.

Example 6

A composition solution was prepared according to the same method as used in the above Example 5, except that the acrylate compound of the following Formula 2b:

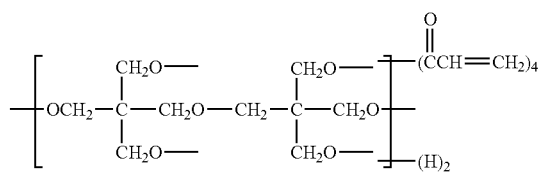

2b instead of the acrylate compound of the above Formula 2a was used, and its physical properties were evaluated and the results are shown in Table 2 below.

Example 7

A composition solution was prepared according to the same method as used in the above Example 5, except that the acrylate compound of the following Formula 2c:

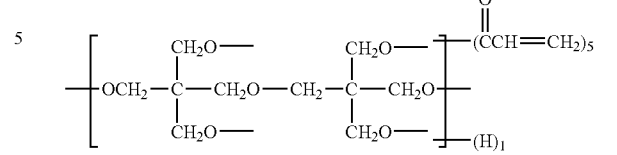

2c instead of the acrylate compound of the above Formula 2a was used, and its physical properties were evaluated and the results are shown in Table 2 below.

Comparative Example 2

A composition solution was prepared according to the same method as used in the above Example 5, except that the acrylate compounds of the above Formulae 2a to 2c were not used, and its physical properties were evaluated and the results are shown in Table 2 below.

TABLE 2

| Category | Sensitivity (mJ/cm$^2$) | Resolution (μm) | Transparency | Resistance to Heat Discoloration |
| --- | --- | --- | --- | --- |
| Example 5 | 230 | 3 | 92 | ○ |
| Example 6 | 220 | 3 | 92 | ○ |
| Example 7 | 230 | 3 | 92 | ○ |
| Comparative Example 2 | 270 | 4 | 88 | X |

From the above Table 2, it can be seen that in Examples 5 to 7 according to the present invention comprising the acrylate having ethylenically unsaturated double bonds of the above Formula 2, transparency and resistance to heat discoloration are particularly excellent, enabling the polymer to be used without difficulties when being applied to interlayer dielectrics in a thick film for a high degree of flatness. To the contrary, in Comparative Example 2, sensitivity is poor and transparency and resistance to heat discoloration are not good, so consequently it is difficult for the polymer to be applied as a thick interlayer dielectric film.

Synthesis Example 8

7 pbw of 2,2'-azobis(2,4-dimethylvaleronitrile), 200 pbw of propyleneglycol monomethyletheracetate, 15 pbw of methacrylic acid, 30 pbw of glycidyl methacrylate, 20 pbw of styrene, 5 pbw of 2-hydroxy ethylacrylate, and 30 pbw of isobornylacrylate were put into a flask with a cooling tube and stirrer, then nitrogen-substituted, and gently agitated. The temperature of the reaction solution was raised to 62° C. and maintained at this temperature for five hours, whereby a polymer solution comprising the acrylic copolymer [a-1] was obtained. 900 pbw of hexane was dripped into the polymer solution thus obtained to precipitate the copolymer. The precipitated copolymer was isolated, 150 pbw of propyleneglycol monomethyletheracetate was added thereto, and it was heated to 40° C. and evaporated under reduced pressure to obtain the copolymer [A-1]. The solid concentration of the copolymer solution thus obtained was 30% by weight, and GPC analysis revealed that the area of the unreacted monomers and polymerization initiator was 2.3% and the weight average molecular weight (Mw) was 12,800 in terms of polystyrene calculation.

Synthesis Example 9

9 pbw of 2,2'-azobis(2,4-dimethylvaleronitrile), 200 pbw of tetrahydrofuran, 10 pbw of methacrylic acid, 30 pbw of glycidyl methacrylate, 20 pbw of styrene, 10 pbw of 2-hydroxy ethylacrylate, and 30 pbw of isobornylacrylate were put into a flask with a cooling tube and stirrer, then nitrogen-substituted, and gently agitated. The temperature of the reaction solution was raised to 62° C. and maintained at this temperature for eight hours, whereby a polymer solution comprising the acrylic copolymer [a-2] was obtained. 900 Pbw of hexane was dripped into the polymer solution thus obtained to precipitate the copolymer. The precipitated copolymer was isolated, 150 pbw of propyleneglycol monomethyletheracetate was added thereto, and it was heated to 40° C. and evaporated under reduced pressure to obtain the copolymer [A-2]. The solid concentration of the copolymer solution thus obtained was 30% by weight, and GPC analysis revealed that the area of the unreacted monomers and polymerization initiator was 0.5% and the weight average molecular weight (Mw) was 9,400 in terms of polystyrene calculation.

Synthesis Example 10

7 pbw of 2,2'-azobis(2,4-dimethylvaleronitrile), 200 pbw of propyleneglycol monomethyletheracetate, 10 pbw of itaconic acid, 25 pbw of glycidyl methacrylate, 30 pbw of styrene, 5 pbw of 2-hydroxy ethylacrylate, and 30 pbw of isobornylacrylate were put into a flask with a cooling tube and stirrer, then nitrogen-substituted, and gently agitated. The temperature of the reaction solution was raised to 62° C. and maintained at this temperature for eight hours, whereby a polymer solution comprising the acrylic copolymer [a-3] was obtained. 900 pbw of hexane was dripped into the polymer solution thus obtained to precipitate the copolymer. The precipitated copolymer was isolated, 150 pbw of propyleneglycol monomethyletheracetate was added thereto, and it was heated to 40° C. and evaporated under reduced pressure to obtain the copolymer [A-3]. The solid concentration of the copolymer solution thus obtained was 30% by weight, and GPC analysis revealed that the area of the unreacted monomers and polymerization initiator was 1.6% and the weight average molecular weight was 9.400 in terms of polystyrene calculation.

Synthesis Example 11

7 pbw of 2,2'-azobis(2,4-dimethylvaleronitrile), 200 pbw of propyleneglycol monomethyletheracetate, 10 pbw of methacrylic acid, 25 pbw of glycidyl methacrylate, 25 pbw of styrene, 10 pbw of 2-hydroxy ethylacrylate, and 30 pbw of isobornylacrylate were put into a flask with a cooling tube and stirrer, then nitrogen-substituted, and gently agitated. The temperature of the reaction solution was raised to 62° C. and maintained at this temperature for eight hours, whereby a polymer solution comprising the acrylic copolymer [a-4] was obtained. 900 Pbw of hexane was dripped into the polymer solution thus obtained to precipitate the copolymer. The precipitated copolymer was isolated, 150 pbw of propyleneglycol monomethyletheracetate was added thereto, and it was heated to 40° C. and evaporated under reduced pressure to obtain the copolymer [A-4]. The solid concentration of the copolymer solution thus obtained was 30% by weight, and GPC analysis revealed that the area of the unreacted monomers and polymerization initiator was 0.7% and the weight average molecular weight was 9,300 in terms of polystyrene calculation.

Comparative Synthesis Example 2

7 pbw of 2,2'-azobis(2,4-dimethylvaleronitrile), 200 pbw of propyleneglycol monomethyletheracetate, 15 pbw of methacrylic acid, 30 pbw of glycidyl methacrylate, 20 pbw of styrene, 5 pbw of 2-hydroxy ethylacrylate, and 30 pbw of isobornylacrylate were put into a flask with a cooling tube and stirrer, then nitrogen-substituted, and gently agitated. The temperature of the reaction solution was raised to 62° C. and then maintained at this temperature for five hours, whereby a polymer solution comprising the acrylic copolymer [b-1] was obtained. The solid concentration of the copolymer solution thus obtained was adjusted to 30% by weight. After GPC analysis, it was revealed that the area of the unreacted monomers and polymerization initiator was 20% and the weight average molecular weight was 12,800 in terms of polystyrene calculation.

Comparative Synthesis Example 3

7 pbw of 2,2'-azobis(2,4-dimethylvaleronitrile), 200 pbw of propyleneglycol monomethyletheracetate, 10 pbw of methacrylic acid, 30 pbw of glycidyl methacrylate, 20 pbw of styrene, 10 pbw of 2-hydroxy ethylacrylate and 30 pbw of isobornylacrylate were put into a flask with a cooling tube and stirrer, then nitrogen-substituted, and gently agitated. The temperature of the reaction solution was raised to 62° C. and then maintained at this temperature for nine hours, whereby a polymer solution comprising the acrylic copolymer [b-2] was obtained. The solid concentration of the copolymer solution thus obtained was adjusted to 30% by weight. After GPC analysis, it was revealed that the area of the unreacted monomers and polymerization initiator was 15% and the weight average molecular weight was 16,800 in terms of polystyrene calculation.

Example 8

Preparation of Photosensitive Resin Composition 100 pbw of the polymer solution obtained from Synthesis Example 8 (copolymer [A-1]) and 25 pbw of the condensate obtained from Synthesis Example 6, [4,4'-[1-[4-[1-[4-hydroxyphenyl]-1-methylethyl]phenyl]ethyllidene]bisphenol 1,2-naptoquinonediazide-5-sulfonic ester], were mixed, dissolved in diethyleneglycol dimethylether to the extent that solid concentration became 35% by weight, and then filtered with a milipore filter of 0.2 μm to prepare a solution of a photosensitive resin composition.

With regard to the photosensitive resin composition prepared above, physical properties were evaluated in the same manner as described above and the results are shown in Table 3 below.

Example 9

The composition solution was prepared according to the same method as used in above Example 8, except that the polymer solution prepared in Synthesis Example 9 was used instead of the polymer solution prepared in Synthesis Example 8, and its physical properties were evaluated and the results are shown in Table 3 below.

Example 10

The composition solution was prepared according to the same method as used in above Example 8, except that the polymer solution prepared in Synthesis Example 10 was used instead of the polymer solution prepared in Synthesis Example 8, and its physical properties were evaluated and the results are shown in Table 3 below.

Example 11

The composition solution was prepared according to the same method as used in above Example 8, except that the polymer solution prepared in Synthesis Example 11 was used instead of the polymer solution prepared in Synthesis Example 8, and its physical properties were evaluated and the results are shown in Table 3 below.

Comparative Example 3

The composition solution was prepared according to the same method as used in above Example 8, except that the polymer solution prepared in Comparative Synthesis Example 2 was used instead of the polymer solution prepared in Synthesis Example 8, and its physical properties were evaluated and the results are shown in Table 3 below.

Comparative Example 4

The composition solution was prepared according to the same method as used in above Example 8, except that the polymer solution prepared in Comparative Synthesis Example 3 was used instead of the polymer solution prepared in Synthesis Example 8, and its physical properties were evaluated and the results are shown in Table 3 below.

TABLE 3

| Category | Sensitivity (mJ/cm$^2$) | Resolution (μm) | Residual Film Rate (%) | Transparency (%) | Resistance to Heat Discoloration |
|---|---|---|---|---|---|
| Example 8 | 230 | 3 | 95 | 93 | ◯ |
| Example 9 | 220 | 3 | 94 | 93 | ◯ |
| Example 10 | 230 | 3 | 95 | 94 | ◯ |
| Example 11 | 270 | 3 | 93 | 93 | ◯ |
| Comparative Example 3 | 250 | 4 | 73 | 90 | X |
| Comparative Example 4 | 280 | 5 | 79 | 89 | X |

From the above Table 3, it can be seen that in Examples 8 to 11 according to the present invention using the copolymer wherein the unreacted monomers and polymerization initiator are 5% or less and Mw is 5,000 to 20,000, transparency, residual film rate and resistance to heat discoloration are especially excellent, enabling the polymer to be used without difficulties when being applied to interlayer dielectrics of a thick film for a high degree of flatness. To the contrary, in Comparative Examples 3 and 4, even though sensitivity is good, resolution, residual film rate, transparency and heat resistance are poor and consequently it is difficult for the polymer to be applied as a thick film.

As described above, the photosensitive resin compositions according to the present invention are excellent in several performance factors such as dielectric characteristics, flatness, transparency, developing performance, residual film rate, chemical resistance, and heat resistance, as well as sensitivity and resolution, and in particular they facilitate easy pattern formation into interlayer dielectrics, and they are effective for use as a photoresist in an LCD manufacturing process due to their excellent transmissivity even when prepared as a thick film.

What is claimed is:

1. A photosensitive resin composition comprising:
    (A) an acrylic copolymer obtained by copolymerizing
        i) a compound represented by the following Formula 1:

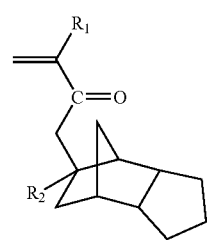

[Formula 1]

wherein $R_1$ and $R_2$ may be the same or different and are each independently a hydrogen atom, a $C_1$–$C_5$ alkyl group, or a $C_1$–$C_5$ alkoxy group;
        ii) an unsaturated carboxylic acid, an unsaturated carboxylic anhydride, or a mixture thereof;
        iii) an epoxy group containing an unsaturated compound; and
        iv) an olefinically unsaturated compound; and
    (B) a 1,2-quinonediazide compound.

2. The photosensitive resin composition according to claim 1, wherein the photosensitive resin composition comprises:
    (A) 100 parts by weight of an acrylic copolymer obtained by copolymerizing
        i) 10 to 70% by weight of a compound represented by said Formula 1;
        ii) 5 to 40% by weight of an unsaturated carboxylic acid, an unsaturated carboxylic anhydride, or a mixture thereof;
        iii) 10 to 70% by weight of an epoxy group containing an unsaturated compound; and
        iv) 10 to 70% by weight of an olefinically unsaturated compound; and
    (B) 5 to 100 parts by weight of a 1,2-quinonediazide compound.

3. The photosensitive resin composition according to claim 1, wherein the acrylic copolymer of (A) has a weight average molecular weight (Mw) of 5,000 to 30,000 in terms of polystyrene calculation.

4. The photosensitive resin composition according to claim 1, wherein the unsaturated carboxylic acid, unsaturated carboxylic anhydride, or mixture thereof of (A) ii) is one or more selected from the group consisting of acrylic acid, methacrylic acid, maleic acid, fumaric acid, citraconic acid, mesaconic acid, and anhydrides of these unsaturated carboxylic acids.

5. The photosensitive resin composition according to claim 1, wherein the epoxy group containing an unsaturated compound of (A) iii) is one or more selected from the group consisting of glycidyl acrylate, glycidyl methacrylate, glycidyl α-ethylacrylate, glycidyl α-n-propylacrylate, glycidyl α-n-butylacylate, acrylic acid-β-methylglycidyl, methacylic acid-β-methylglycidyl, acrylic acid-β-ethylglycidyl, methacylic acid-β-ethylglycidyl, acrylic acid-3,4-epoxybutyl, methacrylic acid-3,4-epoxybutyl, acrylic acid-6,7-epoxyheptyl, methacylic acid-6,7-epoxyheptyl, α-ethylacylic acid-6,7-epoxyheptyl, o-vinylbenzyl glycidyl ether, m-vinylbenzyl glycidyl ether, and p-vinylbenzyl glycidyl ether.

6. The photosensitive resin composition according to claim 1, wherein the olefinically unsaturated compound of (A) iv) is one or more selected from the group consisting of methyl methacrylate, ethylmethacylate, n-butyl methacrylate, sec-butyl methacylate, t-butyl methacrylate, methylacylate, isopropyl acrylate, cyclohexyl methacylate, 2-methylcyclo hexylmethacrylate, dicyclo pentanyloxyethylmethacylate, isobornyl methacrylate, cyclohexylacylate, 2-methylcyclohexylacylate, dicyclopentanyloxyethylacrylate, isobornyl acylate, phenylmethacrylate, phenylacrylate, benzylacrylate, 2-hydroxyethylmethacrylate, styrene, α-methyl styrene, m-methyl styrene, p-methyl styrene, vinyl toluene, p-methoxy styrene, 1,3-butadiene, isoprene, and 2,3-dimethyl 1,3-butadiene.

7. The photosensitive resin composition according to claim 1, wherein the photosensitive resin composition further comprises (C) 1 to 50 parts by weight of a polymerizable compound having ethylenically unsaturated double bonds, (D) 0.1 to 30 parts by weight of an epoxy resin, (E) 0.1 to 20 parts by weight of an adhesion promotor, and (F) 0.0001 to 2 parts by weight of a surfactant, based on 100 parts by weight of the acrylic copolymer of (A).

8. The photosensitive resin composition according to claim 1, wherein the 1,2-quinonediazide compound of (B) is 1,2-quinonediazide 4-sulfonic ester, 1,2-quinonediazide 5-sulfonic ester, or 1,2-quinonediazide 6-sulfonic ester.

9. A photosensitive resin composition comprising:
(A) an acrylic copolymer obtained by copolymerizing
  i) an unsaturated carboxylic acid, an unsaturated carboxylic anhydride, or a mixture thereof;
  ii) an epoxy group containing an unsaturated compound; and
  iii) an olefinically unsaturated compound;
(B) a 1,2-quinonediazide compound; and
(C) an acrylate compound represented by the following Formula 2:

[Formula 2]

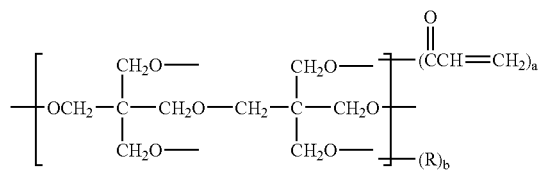

wherein R is a hydrogen atom, or an alkyl group, alkoxy group, or alkanoyl group of $C_1$–$C_5$; and $1<a<6$ and $a+b=6$.

10. The photosensitive resin composition according to claim 9, wherein the photosensitive resin composition comprises:
(A) 100 parts by weight of an acrylic copolymer obtained by copolymerizing
  i) 5 to 40% by weight of an unsaturated carboxylic acid, an unsaturated carboxylic anhydride, or a mixture thereof;
  ii) 10 to 70% by weight of an epoxy group containing an unsaturated compound; and
  iii) 10 to 70% by weight of an olefinically unsaturated compound;
(B) 5 to 100 parts by weight of a 1,2-quinonediazide compound; and
(C) 1 to 50 parts by weight of an acrylate compound represented by said Formula 2.

11. The photosensitive resin composition according to claim 9, wherein the acrylic copolymer of (A) has a weight average molecular weight (Mw) of 5,000 to 30,000 in terms of polystyrene calculation.

12. The photosensitive resin composition according to claim 9, wherein the unsaturated carboxylic acid, unsaturated carboxylic anhydride, or mixture thereof of (A) i) is one or more selected from the group consisting of acrylic acid, methacrylic acid, maleic acid, fumaric acid, citraconic acid, mesaconic acid, and anhydrides of these unsaturated carboxylic acids.

13. The photosensitive resin composition according to claim 9, wherein the epoxy group containing an unsaturated compound of (A) ii) is one or more selected from the group consisting of glycidyl acrylate, glycidyl methacrylate, glycidyl α-ethylacrylate, glycidyl α-n-propylacrylate, glycidyl α-n-butylacrylate, acrylic acid-β-methylglycidyl, methacrylic acid-β-methylglycidyl, acrylic acid-β-ethylglycidyl, methacrylic acid-β-ethylglycidyl, acrylic acid-3,4-epoxybutyl, methacrylic acid-3,4-epoxybutyl, acrylic acid-6,7-epoxyheptyl, methacrylic acid-6,7-epoxyheptyl, α-ethylacrylic acid-6,7-epoxyheptyl, o-vinylbenzyl glycidyl ether, m-vinylbenzyl glycidyl ether, and p-vinylbenzyl glycidyl ether.

14. The photosensitive resin composition according to claim 9, wherein the olefinically unsaturated compound of (A) iii) is one or more selected from the group consisting of methyl methacrylate, ethylmethacrylate, n-butyl methacrylate, sec-butyl methacrylate, t-butyl methacrylate, methylacrylate, isopropyl acrylate, cyclohexyl methacrylate, 2-methylcyclo hexylmethacrylate, dicyclopentanyloxyethylmethacrylate, isobornyl methacrylate, cyclohexylacrylate, 2-methylcyclohexylacrylate, dicyclopentanyloxyethylacrylate, isobornyl acrylate, phenylmethacrylate, phenylacrylate, benzylacrylate, 2-hydroxyethylmethacrylate, styrene, α-methyl styrene, m-methyl styrene, p-methyl styrene, vinyl toluene, p-methoxy styrene, 1,3-butadiene, isoprene, and 2,3-dimethyl 1,3-butadiene.

15. The photosensitive resin composition according to claim 9, wherein the 1,2-quinonediazide compound of (B) is 1,2-quinonediazide 4-sulfonic ester, 1,2-quinonediazide 5-sulfonic ester, or 1,2-quinonediazide 6-sulfonic ester.

16. The photosensitive resin composition according to claim 9, wherein the photosensitive resin composition further comprises one or more additives selected from the group consisting of (C) 1 to 50 parts by weight of a polymerizable compound having ethylenically unsaturated double bonds, (D) 0.1 to 30 parts by weight of an epoxy resin, (E) 0.1 to 20 parts by weight of an adhesion promotor, and (F) 0.0001 to 2 parts by weight of a surfactant, based on 100 parts by weight of the acrylic copolymer of (A).

* * * * *